United States Patent [19]

Satoh

[11] Patent Number: 5,422,228
[45] Date of Patent: Jun. 6, 1995

[54] METHOD OF PRODUCING THIN FILM MULTI-LAYERED SUBSTRATE

[75] Inventor: Kazuaki Satoh, Kawasaki, Japan

[73] Assignee: Fujitsu Limited, Kawasaki, Japan

[21] Appl. No.: 100,964

[22] Filed: Aug. 3, 1993

[30] Foreign Application Priority Data

Aug. 5, 1992 [JP] Japan ................ 4-209225

[51] Int. Cl.⁶ .............................................. G03C 5/00
[52] U.S. Cl. .................................. 430/311; 430/327; 205/220
[58] Field of Search ............... 430/311, 313, 322, 327, 430/271, 277; 205/220

[56] References Cited

U.S. PATENT DOCUMENTS

| | | | |
|---|---|---|---|
| 4,952,285 | 8/1990 | Lin | 204/27 |
| 5,175,399 | 12/1992 | Mori | 174/256 |

FOREIGN PATENT DOCUMENTS 3-005907  1/1991  Japan .
4-051518  2/1992  Japan .

OTHER PUBLICATIONS

English language Abstracts for JP 03-005907.
English language Abstract for JP 04-051518.

*Primary Examiner*—Marion E. McCamish
*Assistant Examiner*—Kathleen Duda
*Attorney, Agent, or Firm*—Staas & Halsey

[57] ABSTRACT

A method of producing a thin film multi-layered substrate involving the steps of subjecting a copper wiring formed on a substrate to chromate treatment with an aqueous solution containing potassium bichromate or sodium bichromate as a principal component and containing chromic anhydride blended therewith, forming an interlevel insulating film consisting of photosensitive polyimide on the copper wiring, and exposing and developing the photosensitive polyimide film to form a pattern. A miniature pattern can be formed at a high speed and with high production yield.

4 Claims, 8 Drawing Sheets

METHOD OF PRODUCING THIN FILM MULTI-LAYERED SUBSTRATE

BACKGROUND OF THE INVENTION

1. Field of the Invention

This invention relates to a method of producing a thin film multi-layered substrate.

2. Description of the Related Art

Recently, demand for a higher operation speed and a higher integration density of LSIs has been ever-increasing in order to reduce machine cycles in data processing apparatuses such as computers and electronic devices. With such a demand, signal delay of a wiring substrate on which electronic components such as the LSIs are packaged has become a problem for reducing the machine cycles, and demand for a higher operation speed in this packaging system has become stronger.

Therefore, a high density multi-layered substrate using an organic polymer having a small dielectric constant such as a photosensitive polyimide resin for an inter-level insulating layer to improve a signal propagation speed of the wiring substrate has been proposed.

A method of producing a thin film multi-layered substrate according to the prior art is shown in FIGS. 8a to 8c of the accompanying drawings. According to this method, a plating base conductor 6 is first formed on an insulating substrate 5 by sputtering, or the like, and then an electrolytic copper plating wiring 7 is formed by an additive process or a substractive process (see FIG. 8a).

Next, a polyimide precursor 8 which becomes a polyimide resin after heating and curing and has photosensitivity is coated, and via-holes 9 are formed by effecting exposure and development through a photomask having a pattern of the via-holes 9. The polyimide precursor 8 is then heated and cured to provide an inter-level insulating film 2 (see FIG. 8b).

A second layer wiring is obtained by forming once again the copper plating wiring 7 by the processes shown in FIGS. 8a and 8b, and these process steps are thereafter repeated to obtain a thin film multi-layered wiring substrate shown in FIG. 8c.

According to such a method, however, a chemical reaction takes place between the copper plating wire 7 and the polyimide precursor 8 after the wiring 7 is 10 formed, and a reaction product is formed on the copper plating wiring 7. As a result, the resistance value of the via-hole portions 9 becomes extremely high and exerts an adverse influence on signal transmission characteristics.

Japanese Unexamined Patent Publication (Kokai) No. 60-135902 proposes a method which solves the problem described above and comprises the steps of coating a corrosion-resistant conductor film on the copper plating wiring 7, coating, exposing and developing a photosensitive organic polymer material and then forming the via-holes by removing the conductor film. However, this method is not free from the problem that reliability of inter-level connection drops due to side etching that occurs at the time of etching of the conductor film.

Under such circumstances, a polyimide having, for example, a high aspect resolution and low heat expansion coefficient has been proposed in recent years as a photosensitive polyimide effective for forming a high density wiring pattern, and polyimide having a film thickness of about 40 μm (at the time of development) and a resolution capability of a via-hole diameter of 30 μm has been put on the market.

However, this characteristic is for a Cr pattern, and when a Cu conductor is used, a certain specific sensitizer reacts with Cu in addition to the photosensitive polyimide, so that gelation of amic acid itself or a certain reaction occurs and impedes flattening of polyimide, and eventually, development becomes impossible.

To solve such a problem, a method of forming a barrier metal of Cu/Cr or Cu/Ti on an upper layer without using the Cu single substance for patterning may be possible. However, if Cu is exposed on the pattern end surface, the reaction product proceeds to the surface of an object of development during pre-baking, and the same phenomenon occurs in the same way as on the Cu surface. Accordingly, development becomes impossible. Moreover, plating of the barrier metal is extremely difficult by electroplating or electroless plating, electrolytic dissociation of the single substance is difficult, too, and plating is not possible in the case of Cr due to stress and chemical resistance, and in the case of Ti because it is an active metal.

Japanese Unexamined Patent Publication (Kokai) No. 3-5907 discloses chromate plating on the surface of a copper coil pattern in order to protect the copper coil pattern of a thin film magnetic head coil from denaturation and degradation. However, this reference does not definitely describe the chromate treatment, and also does not describe at all the problems occurring due to the reaction between copper and polyimide and a solution for such problems.

To solve the problem of conduction defect resulting from the reaction between copper and the polyimide precursor that occurs when the polyimide pattern is formed on the copper wiring, Japanese Unexamined Patent Publication (Kokai) No. 4-51518 teaches to treat the copper wiring with chromic acid or a chromate, or with a bichromate, before the formation of the polyimide film. However, the reference does not at all teach or suggest to use the bichromate after mixing it with chromic acid or the chromate when such a treatment is carried out.

As described above, exposure of Cu on the pattern end surface becomes an important problem of the photosensitive polyimide process during the formation of a miniature pattern, and metal coating as a barrier involves many difficulties.

Particularly in the case of photosensitive polyimide of a low thermal expansion and thick film type which has a high aspect resolution, selection of the photosensitizers is inevitably limited. In other words, there remains the problem that the additive reacts with Cu of the exposed portion and is likely to induce inferior development.

SUMMARY OF THE INVENTION

The present invention is directed to solving the problems with the prior art described above, and aims at providing a method of producing a thin film multi-layered substrate which can form a miniature pattern at a high speed and with a high production yield by forming a barrier effective for the photosensitive polyimide on a Cu wiring.

To accomplish the object described above, the present invention provides a method of producing a thin film multi-layered substrate comprising the steps of subjecting a copper wiring formed on a substrate to chromate treatment with an aqueous solution containing $K_2Cr_2O_7$ or $Na_2Cr_2O_7$ as the principal component and also containing $CrO_3$ added thereto, forming an inter-level insulating film consisting of the photosensitive polyimide on this copper wiring, and then exposing and developing this photosensitive polyimide film to form a pattern.

In the method of the present invention, it is possible to form a corrosion-resistant conductor film consisting of Cr or Ti as the principal component on the copper wiring formed on the substrate and then to subject this copper wiring having the conductor film formed thereon to the chromate treatment described above. In this case, the copper portion exposed from the end surface of the copper wiring is covered with copper-chromium film.

DESCRIPTION OF THE PREFERRED EMBODIMENTS

Figure 1A:
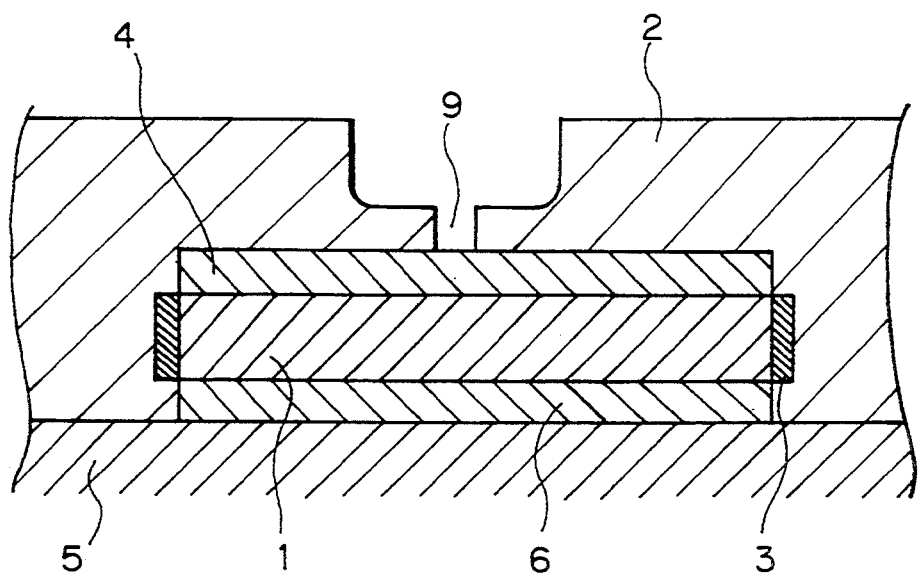
FIGS. 1a and 1b are sectional views of a thin film multi-layered substrate produced according to the present invention.

A barrier to be formed on a Cu pattern to prevent the reaction with a sensitizer, etc., must exhibit its function only at the time of development (till pre-baking), and a barrier effect for the migration of Cu-polyimide occurring during hard baking of post-steps is not so necessary in consideration of the fact that the area of an end surface is not greater than 30% of the pattern surface area. For this reason, means for forming the barrier by the oxidation of Cu is believed effective.

However, a film of oxidized Cu has a great number of pin-holes. To completely oxidize all the pattern end surfaces, wet oxidization (blackening of Cu) is the most optimal method, but NaOH or potassium persulfate must be used as the treating solution and the treating temperature must be at least 100° C. Accordingly, the structure of polyimide itself is adversely affected, and oxidized Cu film itself has so high a dielectric constant that it is not suitable for high speed transfer.

It is known in the art that polyimide itself forms a strong adhesion mechanism with Cr. Therefore, the present inventor has conceived that if a trace amount of Cr exists on the Cu surface, it serves as a barrier and restricts elution of Cu. Thus, the present inventor has reached the idea of the formation of the Cu-chromium film by chromic acid.

This chromate treatment itself is known in the art, and this is a method belonging to chromate conversion coating in the chromate treatment of Al with a solution comprising $CrO_3$ as the principal component. The reaction mechanism as well as the reaction condition are substantially the same, and the Cu-chromium film can be formed by this method.

The formation process of the chromate is shown below:

$$Cu + 2H_2 \rightarrow Cu^{2+} + H_2 \uparrow \qquad (1)$$

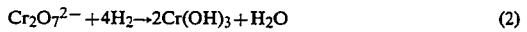

$$Cr_2O_7^{2-} + 4H_2 \rightarrow 2Cr(OH)_3 + H_2O \qquad (2)$$

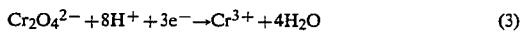

$$Cr_2O_4^{2-} + 8H^+ + 3e^- \rightarrow Cr^{3+} + 4H_2O \qquad (3)$$

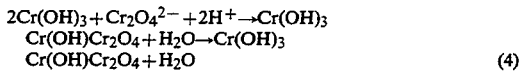

$$2Cr(OH)_3 + Cr_2O_4^{2-} + 2H^+ \rightarrow Cr(OH)_3$$
$$Cr(OH)Cr_2O_4 + H_2O \rightarrow Cr(OH)_3$$
$$Cr(OH)Cr_2O_4 + H_2O \qquad (4)$$

$$\rightarrow Cr_2O_3 \; CrO_3 \; xH_2O \qquad (5)$$

As is obvious from the reaction formulas given above, $Cr_2O_7^{2-}$ and $Cr_2O_4^{2-}$ contribute to the formation of the chromate layer, and a solution consisting of $K_2Cr_2O_7$ or $Na_2Cr_2O_7$ is used as the treating solution. $CrO_3$ is added as an oxidizing agent so as to convert Cu to CuO before the reaction of the formula (1) and to further promote conversion to $Cu^{2+}$.

The composition of the chromium chromate film obtained hereby is a composition of the product of the formula (4) or (5), and the Cr component generates the adhesion reaction with polyimide and prevents participation of the sensitizer.

Hereinafter, embodiments of the present invention will be illustrated.

Figure 2:
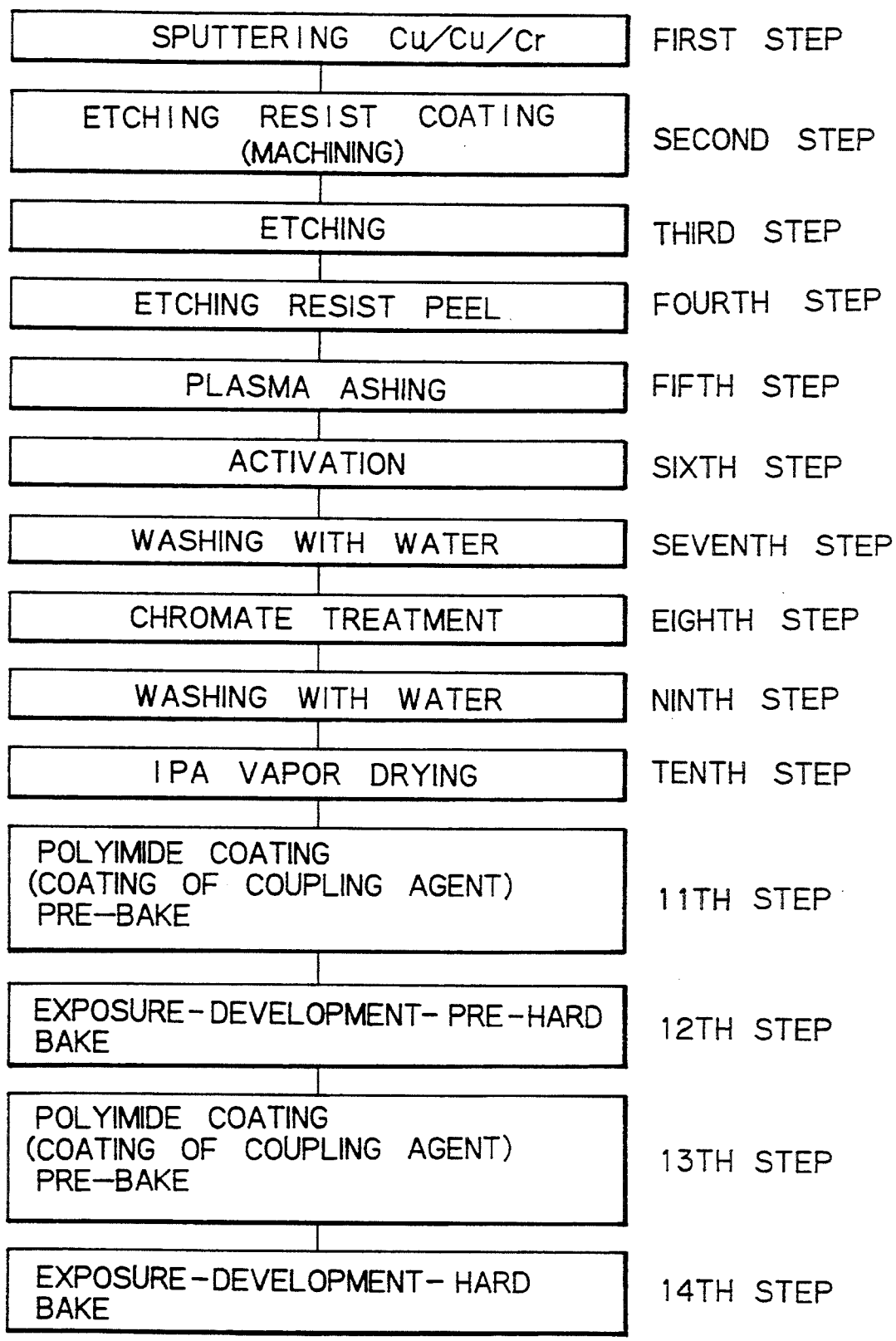
FIG. 2 is a schematic sectional view showing a step of forming a first layer of a thin film multi-layered substrate.
Figure 3:
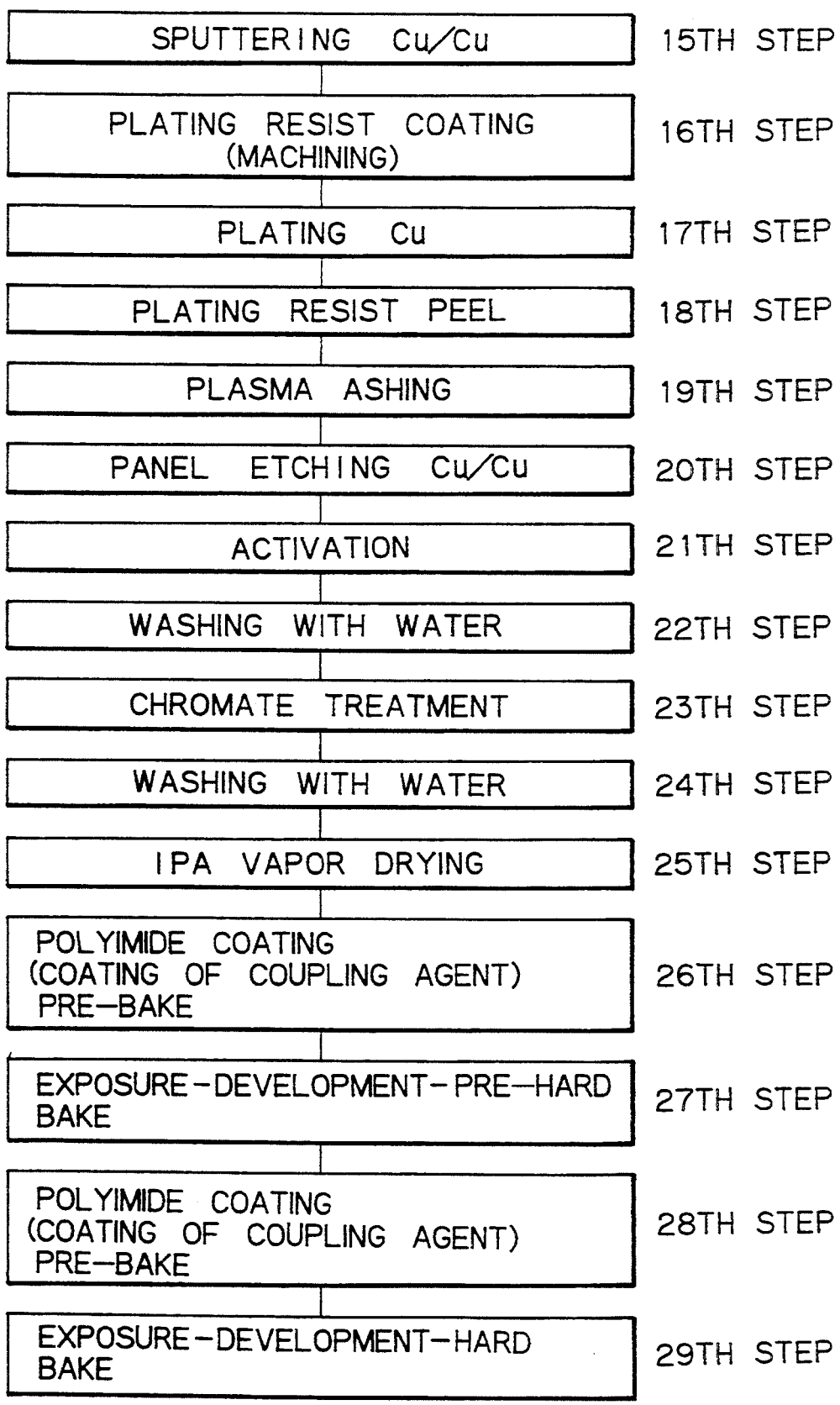
FIG. 3 is a schematic sectional view showing a step of second et seq. layers of the thin film multi-layered substrate.
Figure 4A:
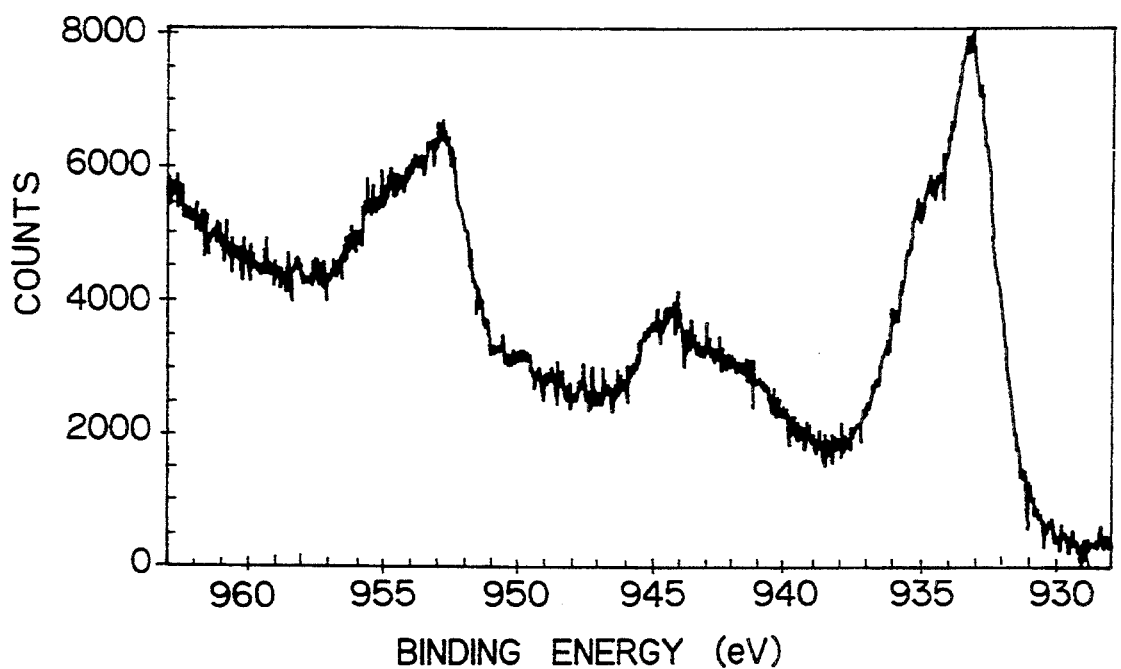
FIGS. 4a and 4b are diagrams showing the results of ESCA analysis.
Figure 4B:
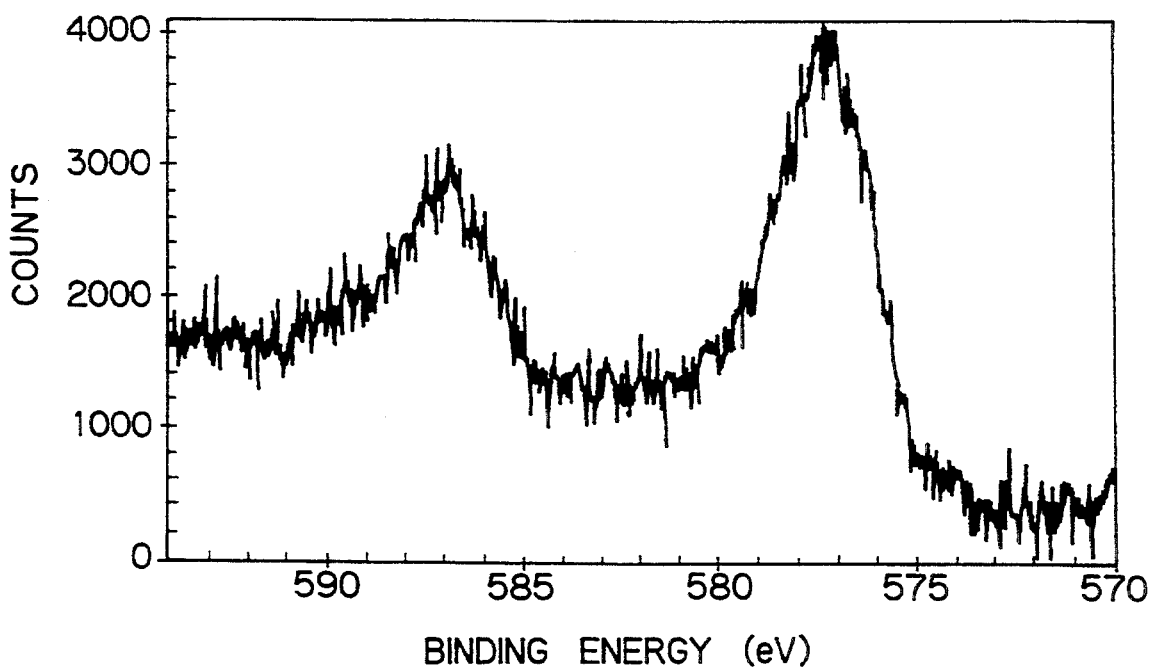
Figure 5A:
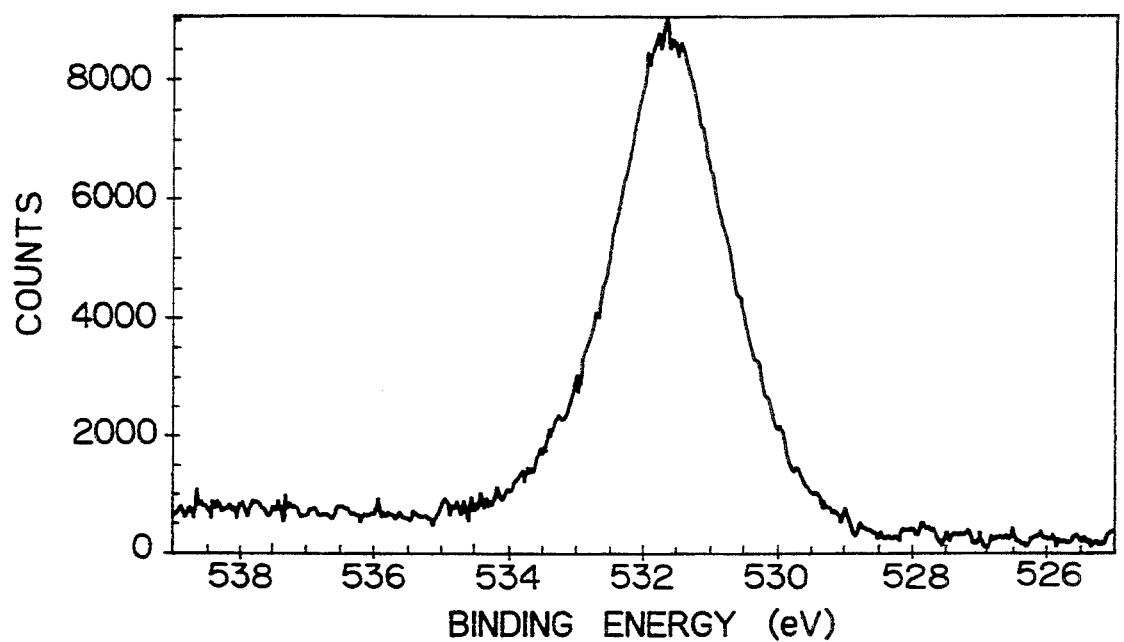
FIGS. 5a and 5b are diagrams showing the results of ESCA analysis.
Figure 5B:
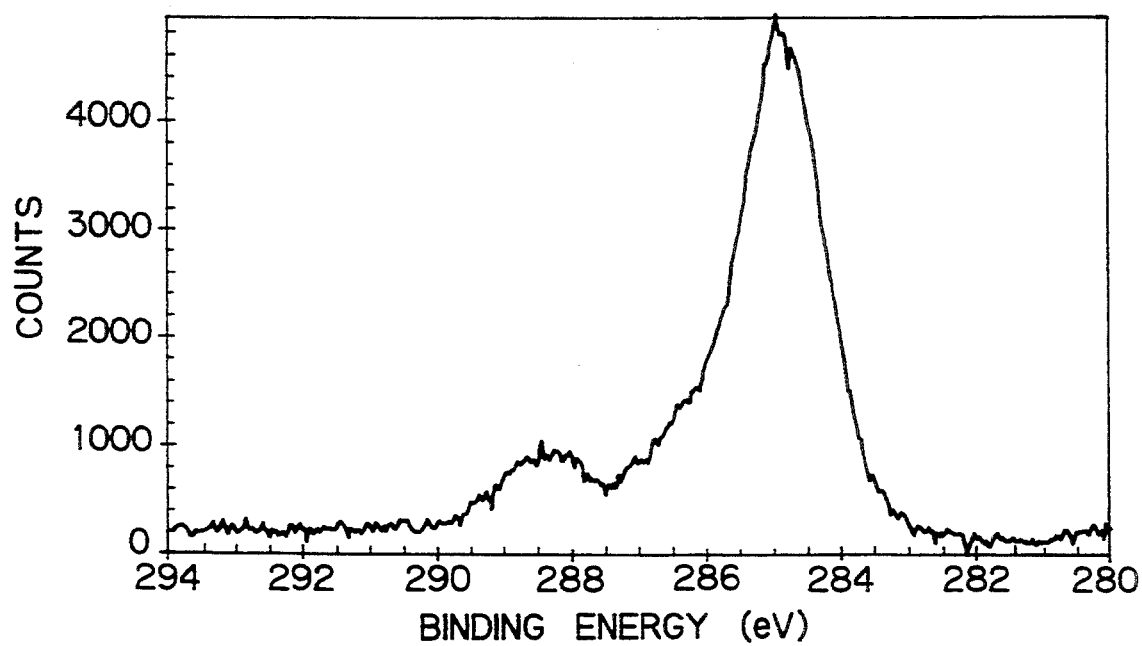

FIGS. 2 and 3 show the production steps of the thin film multi-layered substrate. Incidentally, FIG. 2 shows the production steps of the first layer and FIG. 3 shows the production steps of the second layer et seq.

The production steps of the first layer will now be explained. First of all, sputtering is applied to an insulating substrate 5 such as a ceramic substrate to form a thin conductor film (first step). The thin conductor film comprises a sputter layer of three Cr, Cu and Cr layers.

Next, after an etching resist is coated (second step), etching is carried out (third step). Further, after the etching resist is peeled, organic matter is removed by plasma ashing to form a collective layer (4th and 5th steps).

After the copper layer is activated, the chromate treatment is carried out (6th, 7th and 8th steps). A mixed solution of 80 to 120 g/l, preferably 100 to 110 g/l (optimally 100 g/l) of $K_2Cr_2O_7$ or $Na_2Cr_2O_7$ and from 10 to 35 g/l, preferably 20 to 30 g/l (optimally 30 g/l) of $CrO_3$ is used as the chromate treating solution.

After the chromate treatment is thus conducted, the substrate is washed with water (9th step), is vapor-dried with isopropyl alcohol (10th step), is subjected to polyimide coating and is then pre-baked (11th step). Thereafter, exposure, development and pre-hard-baking is carried out in a customary manner, polyimide is again coated and the substrate is pre-baked (12th and 13th steps). The exposure, development and hard-baking step is carried out (14th step) and the polyimide insulating layer having via-holes opened therein is laminated on the collective layer.

Figure 1B:
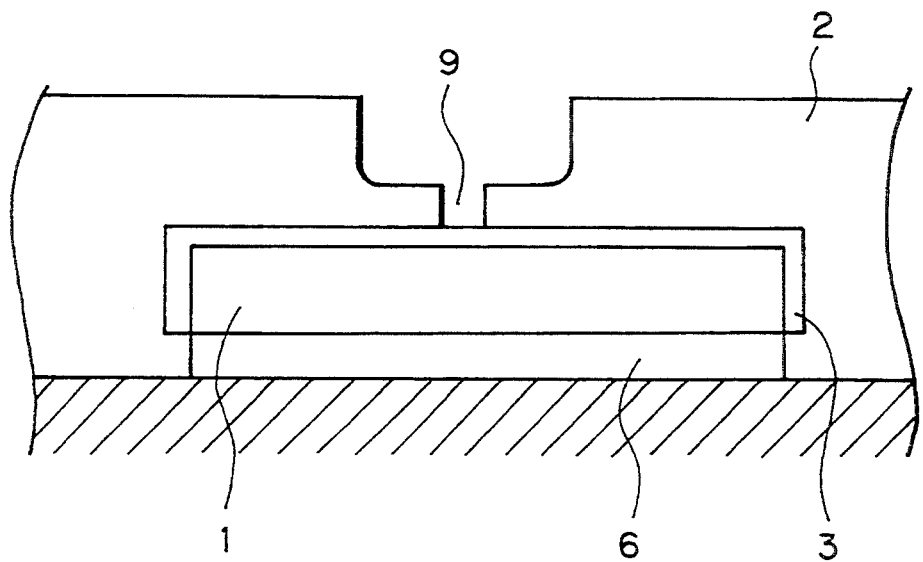

The structure of the film formed by the production steps described above is shown in FIG. 1a. The chromate treatment film 3 is formed on the end surface of the copper wiring 1 by the chromate treatment, and this film functions as the barrier during the development process. A corrosion-resistant film such as Ti can be used as the conductor film 4 instead of Cr. When the conductor film 4 is not disposed on the copper wiring 1 as shown in FIG. 1b, the upper and end surfaces of the copper wiring 1 are covered with the chromate treatment film 3 and the barrier is formed by the chromate treatment.

The film formation steps of the second layer et seq., are carried out in substantially the same way as the film formation steps of the first layer. First of all, the plating base layer 6 is formed by sputtering of Cr and Cu (15th step). Then, the plating resist is coated and the copper wiring 1 is formed by Cu plating (16th and 17th steps).

Next, peeling of the plating resist and the plasma ashing steps is carried out, and the Cr and Cu sputter layer other than the wiring pattern is removed by panel etching (18th to 20th steps). Thereafter, the same production steps, which start with the activation step (21th step), as in the film formation step of the first layer described above are carried out and the second layer shown in the drawing is formed (22nd to 29th steps). To form the third layer et seq., the 15th to 29th steps are repeated.

Next, the experimental results of the thin film multi-layered substrate produced by the steps described above will be illustrated. The composition of the chromate treating solution used for the experiment consisted of 80 to 120 g/l (optimally 100 g/l) of $K_2Cr_2O_7$ or $Na_2Cr_2O_7$ and 10 to 35 g/l (optimally 30 g/l) of $CrO_3$, the liquid temperature was 20° to 30° C. (theoretical value: 25° C.) and the treating temperature was 4 to 6 minutes (theoretical value: 5 minutes). The treatment was carried out with gentle stirring of the solution.

The defect ratio of the substrate treated with this treating solution due to inferior via-hole development was drastically reduced from 20% to dozens of ppm. Although undulation of 2 to 3 μm occurred in an ester bond type photosensitive polyimide, which was believed to have a relatively small influence of Cu, due to the influence of Cu exposed on the end surface of the pattern, this undulation could be reduced to 0.5 μm or below, and inferior development was drastically reduced. Etching of Cu by the treating solution hardly occurred, and a dimensional change of the pattern could not be observed.

Further, although it has been hardly possible according to the prior art technique to develop the photosensitive polyimide directly on Cu, it was confirmed that characteristics equivalent to the resolution of Cr could be obtained by applying the treatment described above. The change of the hard baked polyimide could not be observed, either.

Figure 6A:
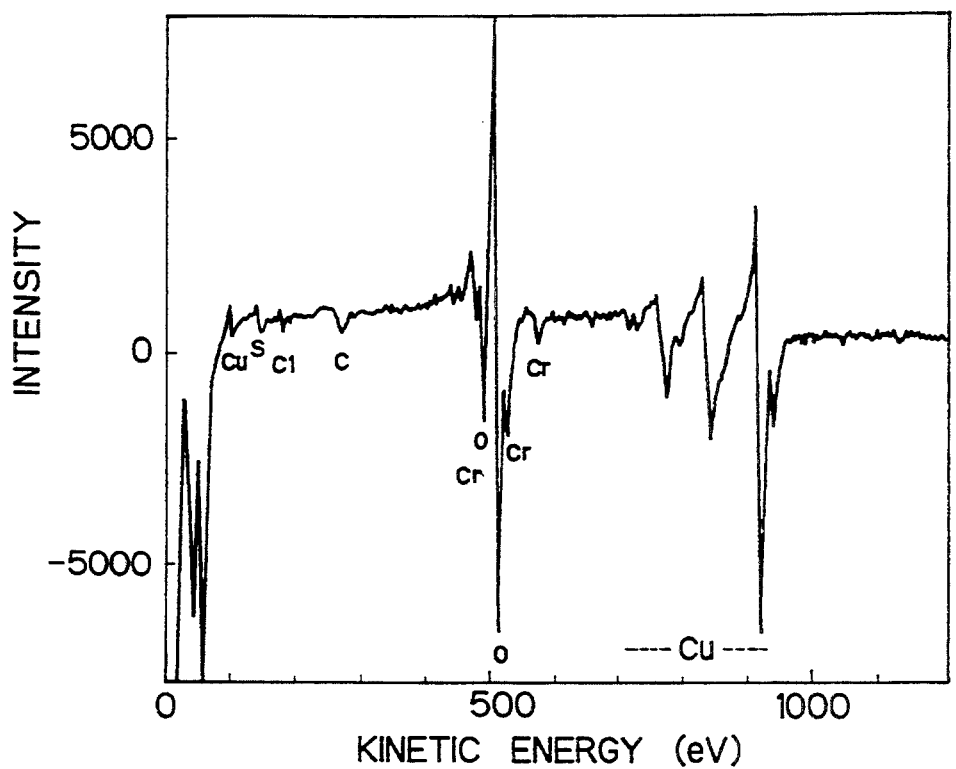
FIGS. 6a and 6b are diagrams showing the results of AES analysis.
Figure 6B:
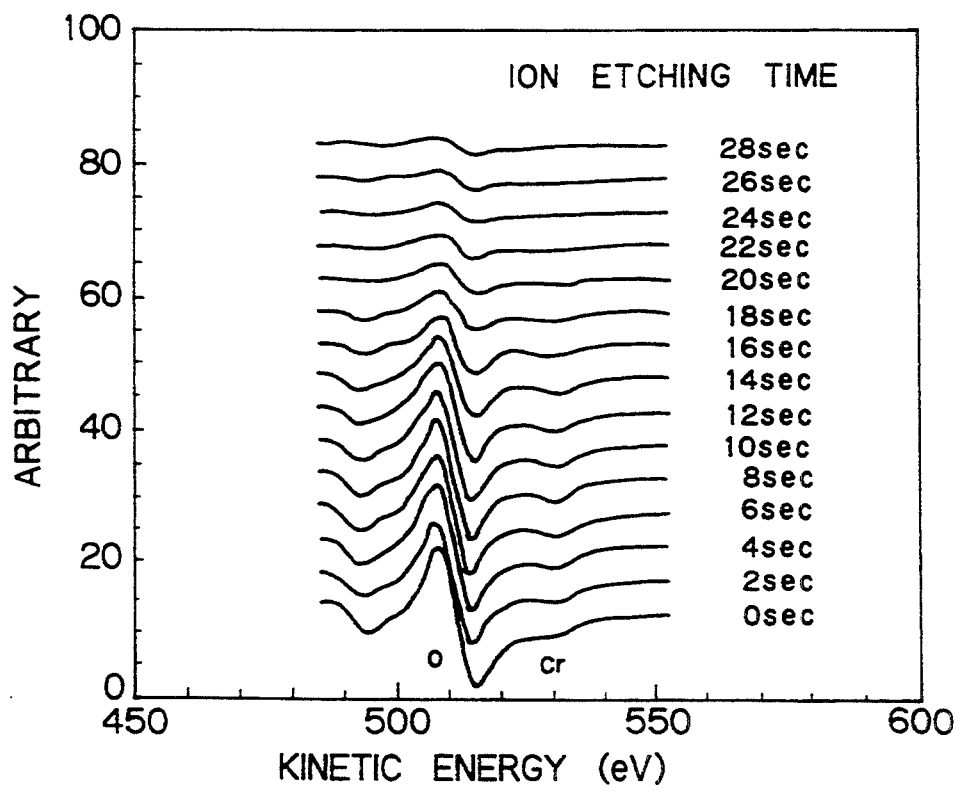

The results of the ESCA analysis (X-ray photoelectric photometry) of the Cu surface treated with the treating solution described above are shown in FIGS. 4a, 4b and 5a, 5b, and the results of the AES analysis (scanning type Auger electron photometry) are shown in FIGS. 6a and 6b.

FIGS. 4a, 4b, 5a and 5b show the photoelectron spectra of Cu, Cr, O and C, respectively. It can be understood by the observation of the Cu 2p 2/3 peak, the Cr 2p 3/2 peak, the C 1s peak and the O 1s peak positions that Cu slightly exists as $Cu_2O$ and $CuO$, Cr mainly exists as $Cr_2O_3$ but has a large possibility of existence as $Cr(OH)_3$ and $CuCr_2O_4$, C is C-C, C-H, C-O and C=O, but since the major proportions are M-OH and M-O from the peak of O, C has a large possibility of external attachment.

Accordingly, the resulting chromate treatment film and the formation reaction are believed to predominantly rely on the formula (5) among the formulas described above, and the formula (4) is believed to express the reaction process.

Further, it is assumed from the results of the AES analysis shown in FIGS. 6a and 6b that the film thickness of the chromate treatment film is below 50 Å because the Cr component disappears at about 16 seconds from etching.

The characteristics of the chromate treatment film obtained from the aqueous bath containing only sodium bichromate or potassium bichromate greatly affect the polyimide film after hard baking is completed. They particularly affect adhesion between copper and polyimide, and partial peeling of the polyimide film was observed in cross-cut after a pressure cooker test (121° C. at 2 atm) for 24 hours. When hard baking was carried out five times at 350° to 450° C. for 3 hours, partial peeling similarly occurred in cross-cut. To cope with a partial adhesion defect of the polyimide film described above, the method of the present invention carries out the chromate treatment while activating copper. The treatment by a single bath of a chromate involves the limitation that the operation must be carried out at a normal temperature from the aspect of a working factor.

Figure 7:
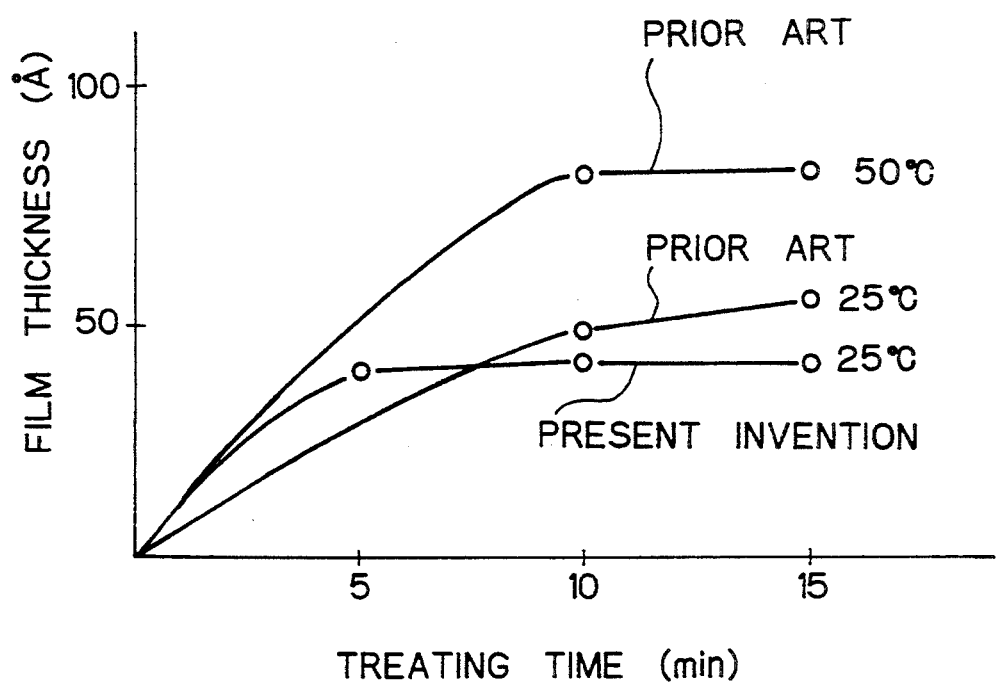
FIG. 7 is a graph showing the relationship between the thickness of a copper-chromium film and a chromate treatment time.
Figure 8A:
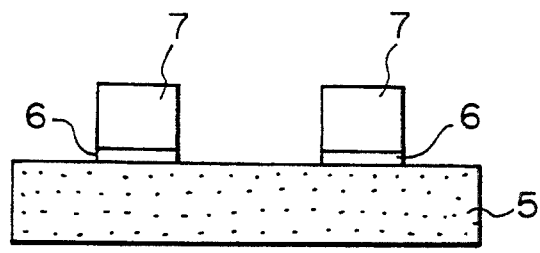
FIGS. 8a to 8c are sectional views each showing a thin film multi-layered substrate according to the prior art.
Figure 8B:
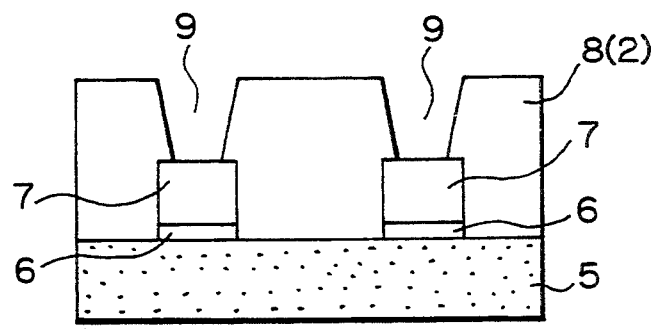
Figure 8C:
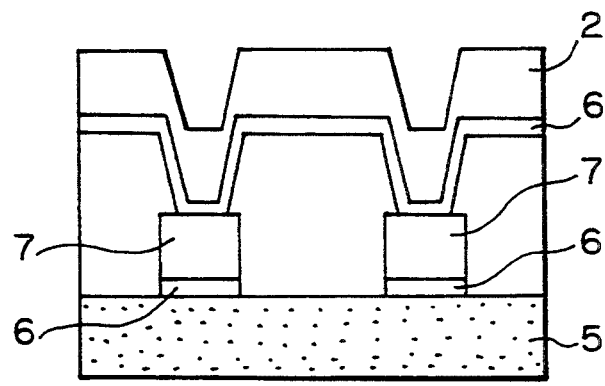

The thickness of the copper-chromium film on the copper surface was measured by the AES analysis for each of the cases where the chromate treatment was carried out using a water bath containing 100 g/l of potassium bichromate and 30 g/l of chromic anhydride in the same way as described above (the present invention) and the case where the chromate treatment was carried out in accordance with the method of the aforementioned Japanese Unexamined Patent Publication (Kokai) No. 4-51518. The results are shown in FIG. 7 in the relation between the treating time and the thickness of the film. It can be understood from FIG. 7 that according to the method of the present invention, a stable film thickness can be obtained at a normal temperature. Adhesion of the polyimide film was evaluated when the chromate treatment was carried out in accordance with the method of the present invention described above. It was confirmed that adhesion was excellent after the pressure cooker test at 350° to 450° C. for 200 hours and ten cycles of hard baking for 3 hours.

As is obvious from the explanation given above, since the present invention can form an effective barrier for the photosensitive polyimide on the copper wiring, the present invention can form a miniature pattern at a high speed and with high production yield.

I claim:

1. A method of producing a thin film multi-layered wiring substrate comprising the steps of:
   subjecting a copper wiring formed on a substrate to a chromate treatment using an aqueous solution containing potassium bichromate or sodium bichromate as a principal component thereof and containing chromic anhydride blended therewith;
   forming an inter-level insulating film consisting of photosensitive polyimide on said copper wiring; and exposing and developing said photosensitive polyimide film to form a pattern.

2. A method according to claim 1, wherein a corrosion-resistant conductor film consisting of chromium or titanium as a principal component thereof is formed on a first surface of said copper wiring formed on said substrate, and then said chromate treatment is applied to a second surface of said copper wiring where said corrosion-resistant conductor film is not formed thereon.

3. A method according to claim 1, wherein the concentration of potassium bichromate or sodium bichromate in said aqueous solution is from 80 to 120 g/l.

4. A method according to claim 1, wherein the concentration of chromic anhydride in said aqueous solution is 10 to 35 g/l.

* * * * *